United States Patent [19]
Wood et al.

[11] Patent Number: 5,249,450
[45] Date of Patent: Oct. 5, 1993

[54] PROBEHEAD FOR ULTRASONIC FORGING

[75] Inventors: Alan G. Wood; David R. Hembree, both of Boise; Warren M. Farnworth, Nampa; Larry D. Cromar, Boise, all of Id.

[73] Assignee: Micron Technology, Inc., Boise, Id.

[21] Appl. No.: 898,625

[22] Filed: Jun. 15, 1992

[51] Int. Cl.$^5$ .............................. B21J 13/02
[52] U.S. Cl. ................... 72/359; 72/391.2; 72/710; 228/180.22; 437/183
[58] Field of Search ............... 72/391.2, 352, 354.6, 72/358, 359, 710; 228/173.3, 180.2, 205; 437/183; 29/840

[56] References Cited

U.S. PATENT DOCUMENTS

| | | | |
|---|---|---|---|
| 3,589,000 | 6/1971 | Galli | 228/180.2 |
| 3,883,945 | 5/1975 | Wallis | 29/840 |
| 3,918,144 | 11/1975 | Mimata et al. | 228/205 |
| 4,177,665 | 12/1979 | Schurmann | 72/359 |
| 5,116,228 | 5/1992 | Kabeshita et al. | 228/180.2 |
| 5,118,370 | 6/1992 | Ozawa | 437/183 |

FOREIGN PATENT DOCUMENTS

| | | | |
|---|---|---|---|
| 0188948 | 8/1988 | Japan | 437/183 |
| 0197038 | 8/1989 | Japan | 72/359 |
| 0940999 | 7/1982 | U.S.S.R. | 72/710 |

Primary Examiner—David Jones
Attorney, Agent, or Firm—Stanley N. Protigal

[57] ABSTRACT

A wirebond probe head is modified for use in forming raised portions from material. The modified head includes a main portion and a sleeve, with the sleeve functioning as a shroud to reduce the tendency of forged material to exude from the periphery of the wirebond probe. The sleeve may also be vibrationally isolated from the main portion of the head in order to attenuate vibrational energy transferred from the main portion of the head to the sleeve. The inventive head functions by being brought into close proximity to a surface material and applying energy. This results in an ultrasonically formed elevated surface irregularity, or an ultrasonic forging splash, which useful as an electrical contact pad for permanent and semipermanent electrical connections.

16 Claims, 9 Drawing Sheets

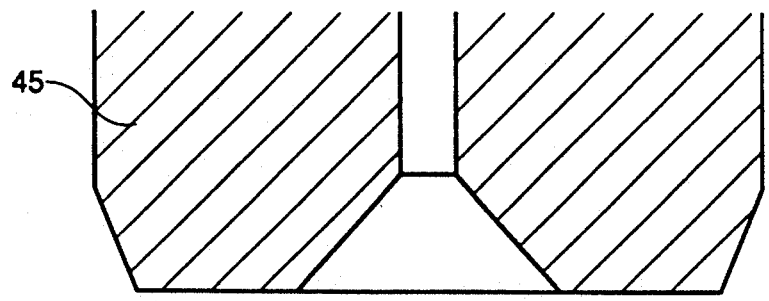
FIG. 10
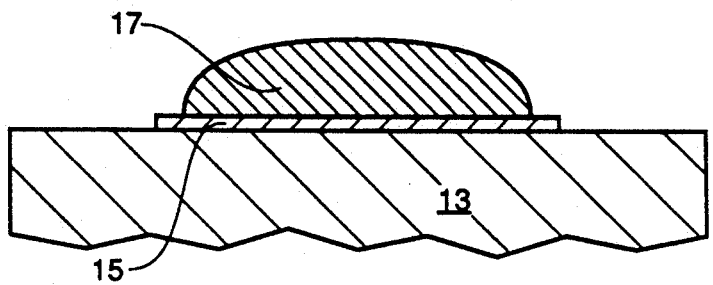
FIG. 11
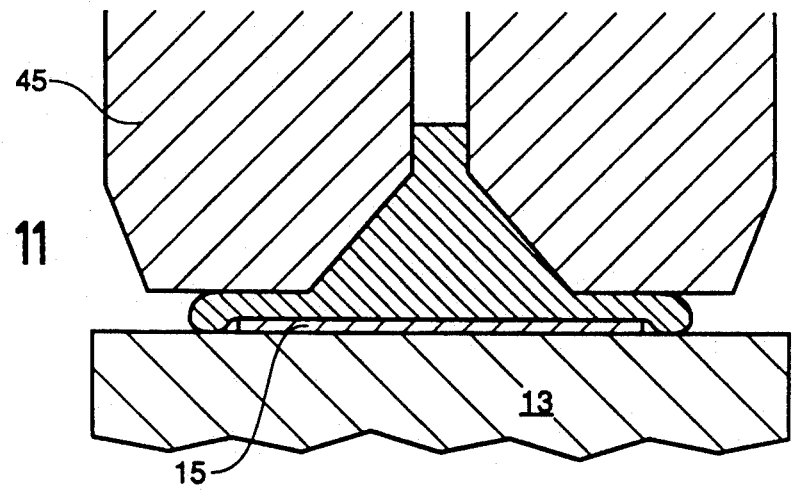
FIG. 12
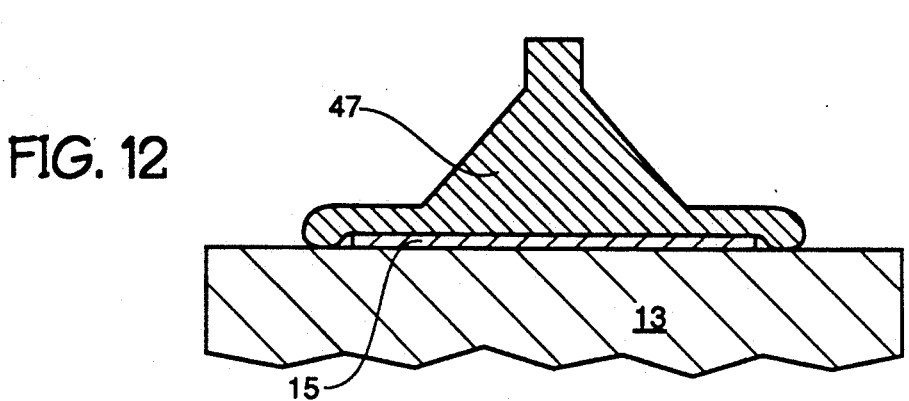

PROBEHEAD FOR ULTRASONIC FORGING

FIELD OF THE INVENTION

This invention relates to formation of raised areas on substrates. More particularly, the invention relates to the formation of raised contacts which are used to connect semiconductor integrated circuit dies with external circuitry. The raised contacts are used to establish connections for testing of the response of digital electronic devices in order to properly determine the functionality of integrated circuits.

BACKGROUND OF THE INVENTION

Integrated circuit memory devices, such as dynamic random access memories (DRAMs) and static random access memories (SRAMs) undergo electrical testing by the manufacturer during production and often by the end user, for example, in a memory test conducted during computer initialization. As densities of the memory device increase, so that individual IC's are capable of storing sixteen or more megabits of information, the time necessary for testing the IC's increases as well.

While there are various techniques purposed for testing, burning in and characterizing a singulated die, it would be advantageous to be able to "wafer map" the die prior to assembly with as many performance characteristics as possible. Ideally, one would want to be able to map the wafer with full device characterization.

Typically, in the prior art, IC parts are initially tested at "probe," while in wafer form, in order to determine a general response of the part. If the part appears to be responsive, it is packaged and then run through a series of tests.

There is an increased interest in providing ICs which are fully characterized prior to final packaging. This is desired not only because of the cost of the package, but also because there is demand for multi-chip modules (MCMs), in which multiple ICs in die form are tested and assembled into a single unit.

MCMs create a particular need for testing prior to assembly, as contrasted to the economics of testing parts which are discretely packaged as singulated parts. For discretely packaged parts, if the product yield of good parts from preliminary testing to final shipment (probe-to-ship) is, for example, 95%, one would not be particularly concerned with packaging costs for the failed parts, if packaging costs are 10% of the product manufacturing costs. Even where packaging costs are considerably higher, as in ceramic encapsulated parts, testing unpackaged die is economical for discretely packaged parts when the added costs approximates that of cost of packaging divided by yield:

$$C_{DIE} \times \frac{C_{PACKAGE}}{Yield} = C_{DIE} \times C_{ADDL.\ KGD}$$

where $C$ = cost $C_{DIE}$ = manufacturing cost of functional die $C_{ADDL.\ KGD}$ = additional cost of testing unpackaged die in order to produce known good die (KGD)

Note that in the case of discretely packaged parts, the cost of the die ($C_{DIE}$) is essentially not a factor. This changes in the case of MCMs:

$$(C_{DIE}) \times \frac{(number\ of\ die)}{Yield} \times C_{PACKAGE} = C_{DIE} \times C_{ADDL.\ KGD}$$

Note that again $C_{DIE}$ is not a factor in modules having identical part types; however, the equation must be modified to account for varied costs and yields of die in modules with mixed part types.

With MCMs, the cost of packaging a failed part is proportional to the number of die in the module. In the case of a ×16 memory array module, where probe-to-ship yield of the die is 95%, the costs are:

$$\frac{16}{0.95} \times C_{PACKAGE} = C_{ADDL.\ KGD}$$

so the additional costs of testing for known good die (KGD) may be 16 times the cost of testing after assembly of an unrepairable module in order to be economical. This, of course, is modified by the ability to repair some failed modules.

One of the electrical test procedures which is used to determine the viability of semiconductor integrated circuits is burnin. In the burnin procedure, the parts are exercised for a period of time with different temperature cycles, including at elevated temperatures and elevated potentials. This procedure provides an indication of the operation of the device at the different operating temperatures, and also results in a determination of early part failures. During the burnin process, such early failures, known as "infant mortality," is predicted to occur within a particular amount of time. Therefore, if it can be determined that almost all such failures occur within the first 48 hours of burnin testing, then the burnin test can be completed within that time period. Such factors as temperature, process and device type influence when failures stop happening, so the specific burnin time period will vary with part type and other factors. In the case of testing of packaged discrete devices, each device is able to be separately monitored by external test equipment, so that the external test equipment can be used to provide an indication of the time of failure of that particular part.

In testing bare die prior to encapsulation, temporary electrical connection must be effected between the die and a temporary housing fixture. This is accomplished in the bond region, either at the bondpads or closely adjacent the bondpad. In the case of wirebond die, the bondpads are often produced at a level which is not raised above the top surface of the die and may be recessed below the top surface.

One process which causes the top of the bondpads to be recessed is one in which the bondpads are formed, but not formed with raised topography, followed by the formation of a passivation layer. The bondpads are left exposed through the passivation layer, but are recessed below the top of the passivation layer. During wirebonding, the recessed position of the bondpads is inconsequential, but this can create a problem with other attachment techniques. If the die are to be tested prior to encapsulation, the die must be compatable with both the test attachment and the later permanent attachment, and the test attachment must not damage the die in such a way as to inhibit permanent attachment.

This invention has an object of providing a raised conductive portion on a substrate for temporary or permanent electrical attachment of a semiconductor die to an external connector.

Temporary connections to die with recessed bondpads may be accomplished by alignment of the bondpads with a substrate having conductive traces on the substrate. The conductive traces must have raised portions which may be aligned with the bondpads to extend into the recesses to the bondpads. In such designs, there exists a need to produce a layer of material which has the raised portion, wherein the raised portion is exaggerated by extracting material from material which surrounds the raised portion. It is further desired to enhance this raised portion with additional material.

In a prior art technique, raised conductive portions of conductive layers could be formed by photoplating, as shown in FIG. 1. The raised portion is a bump which is used as an electrical contact so that, when a plate is brought into contact with a semiconductor die, the bump engages a bondpad on the die. This contact of the bump with the bondpad on the die presents two problems; dimensional accuracy and distortion.

When the bump is used as an electrical contact to engage a bondpad on a semiconductor die, dimensional accuracy is a requisite. Bondpads on semiconductors are made small (approximately 100μ per side) in order to conserve surface area for active circuitry on the die. In the case of wirebonded die, the size of the bondpad is usually selected to be sufficient to permit a wirebonder to reliably establish wirebond connections to the die. Other connection techniques, such as TAB, have their own requirements, but the bondpads are similarly restricted in size.

The bondpads used in wirebonded die are usually recessed below a passivation layer which borders the bondpads. The passivation layer is a film of insulator, such as BPSG, and can form a barrier to effective contact of the bump with the bondpad if the bump is too large or is out of alignment.

The bumps become distorted when used as contacts, as shown in FIG. 2. While this is intentional, this distortion inhibits further contact and may result in the bump exceeding dimensional limits for mating with a bondpad.

The bump is used as a contact by compressing the conductive layer against a disparate substrate. In one application, raised portions are on a connector which connects external circuitry to a semiconductor die. The raised portions engage bond pads on the die and the raised portion is compressed against the bond pads. The engagement of the raised portions and the bond pads must initially be under sufficient mechanical to break through an oxide film which may exist on the bondpads; especially on bondpads made of aluminum. The pressure may be reduced after compression, but the bumps would already have been distorted by the compression process. Subsequent to the raised portion being used, it may be desired to separate the conductive layer, and thereby disconnect the connector from the bond pads on the die. At this point, the raised portions have been compressed and are unsuitable for reuse without being reformed.

Other techniques include ball bonding, in which wirebonding techniques are used to deposit a small amount of material on a conductive portion. Rather than permitting a wire to remain attached to the bondsite, sufficient energy is applied by the wirebonder to cause the wire to break from the bondsite slightly above the bondsite, thereby leaving an attachment portion of the wire material, known as a ball bond. The material for this process must of course be selected in order to permit the process to be properly implemented. The ball bond is then used as a contact.

SUMMARY OF THE INVENTION

According to the invention, a raised portion is formed from material by bringing a wirebond probe in close proximity to the material and applying energy to the material. In the preferred embodiment, the probe has a center opening and the applied energy is a combination of thermal energy and ultrasonic mechanical vibration of the probe. The process uses ultrasonic forging and results in an ultrasonically formed elevated surface irregularity, or an ultrasonic forging splash.

The ultrasonically formed elevated surface irregularity is preferrably formed from a metallic layer and is useful as an electrical contact pad for permanent and semipermanent electrical connections. In order to increase the height of the ultrasonically formed elevated surface irregularity, the material from which the irregularity is formed is raised in height by depositing material on a substrate on which the layer is formed. The ultrasonically formed elevated surface irregularity therefore is formed, at least in part, from the deposited material, thus resulting in a raised point contact.

The probe may be used to reform a raised portion on a substrate which has been deformed, as by previous use. Subsequent to the raised portion being used, it may be desired to disconnect the connector from the die. At this point, the raised portion is ultrasonically forged, thereby reforming the raised portion.

The process, referred to as doinking, uses ultrasonic forging and results in a doink, which consists of a raised portion of the material, surrounded by a crater. Doinking is the process by which ultrasonic energy is used to forge material, and the ultrasonic forging is used to form a crater in the forged material, with some of the cratered material forming a raised portion, or doink.

In a further embodiment, the wirebond probe includes a main portion and a sleeve. The sleeve functions as a shroud to reduce the tendency of forged material to exude from the periphery of the wirebond probe. The sleeve may also be vibrationally isolated from the main portion of the head in order to attenuate vibrational energy transferred from the main portion of the head to the sleeve.

BRIEF DESCRIPTION OF THE DRAWINGS

FIGS. 10 and 11 show a modified probe being used to form an ultrasonically formed elevated surface irregularity with a less pronounced ridge surrounding the crater;

FIG. 12 shows an ultrasonically formed elevated surface irregularity formed by the engagement of the modified probe of FIGS. 10 and 11.

DETAILED DESCRIPTION OF THE PREFERRED EMBODIMENTS

Figure 1:
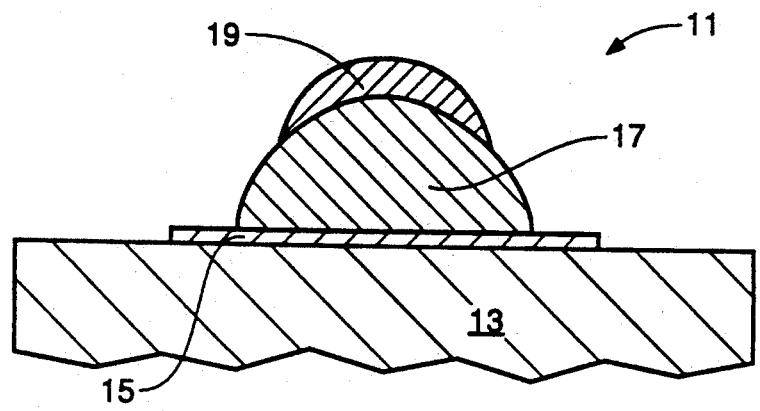
FIG. 1 (prior art) shows a cross-section of substrate on which a raised portion has been formed by photoplating techniques.
Figure 2:
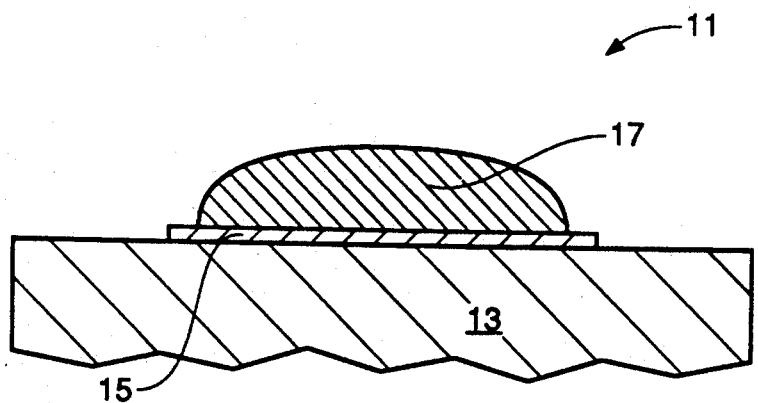
FIG. 2 (prior art) shows the raised portion of FIG. 1 after having been distorted through use as an electrical contact.

FIGS. 1–2 show a plate 11 in cross-section, which consists of a substrate 13 and a conductive layer 15. The conductive layer 15 has deposited thereon a bump 17, which is preferrably formed of malleable material, such as gold. The conductive layer 15 may be of any convenient material, such as copper, and the substrate is either an insulator or a portion of a semiconductor integrated circuit. Additional material 19 may be plated or otherwise deposited on the bump 17. The additional material 19 enhances the height of the bump 17 and is therefore treated as a part of the bump 17.

The bump 17, in the preferred embodiment, is used as an electrical contact so that, when the plate 11 is brought into contact with a semiconductor die (not shown in FIGS. 1–2), the bump 17 engages a bondpad on the die. The bumps become distorted when used as contacts, as shown in FIG. 2. While this is intentional, this distortion inhibits further contact and may result in the bump 17 exceeding dimensional limits for mating with a bondpad.

Figure 3:
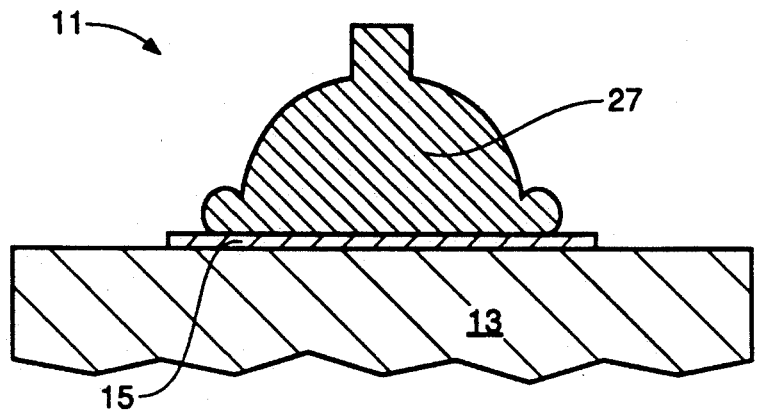
FIG. 3 (prior art) shows a cross-section of substrate on which a raised portion has been formed by ball bonding techniques.
Figure 4:
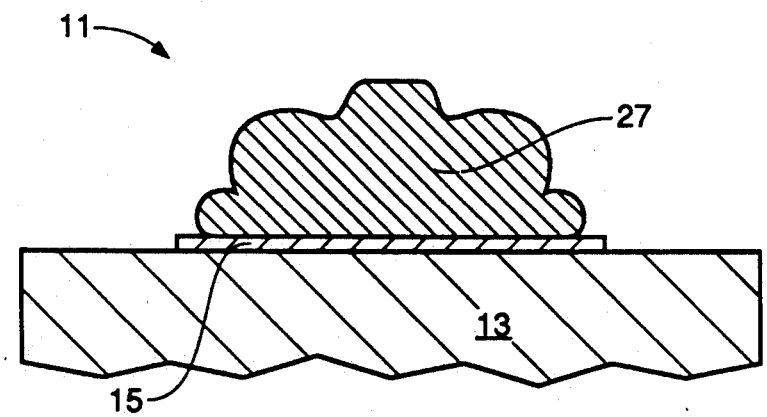
FIG. 4 (prior art) shows the ball bond of FIG. 3 after having been distorted through use as an electrical contact.

FIGS. 3–4 show a ball bond bump 27 which is also formed from a conductive layer 15 on a substrate 13. The ball bond bump 27 is shown in FIG. 4 subsequent to engagement with a bondpad on the die. The ball bond bump 27 may be formed from any malleable material, including gold and aluminum, which are used in preferred embodiments. The ball bond bump 27 is formed by using a wirebonder which deposits a small amount of material on the conductive layer 15 on the substrate. Rather than permitting a wire to remain attached to the bondsite, sufficient energy is applied by the wirebonder to cause the wire to break from the bondsite slightly above the bondsite, thereby leaving an attachment portion of the wire material, known as a ball bond bump 27. The ball bond 27 is then used as a contact, and may be referred to as a ball bond bump contact.

Figure 5:
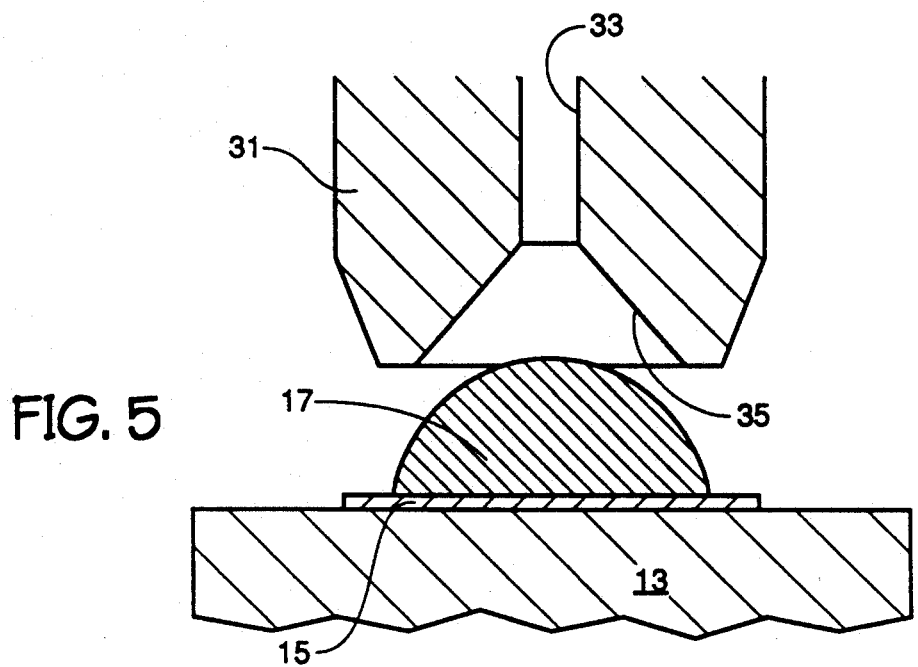
FIG. 5 shows a cross-section of substrate prior to being engaged by a wirebonder probe.
Figure 6:
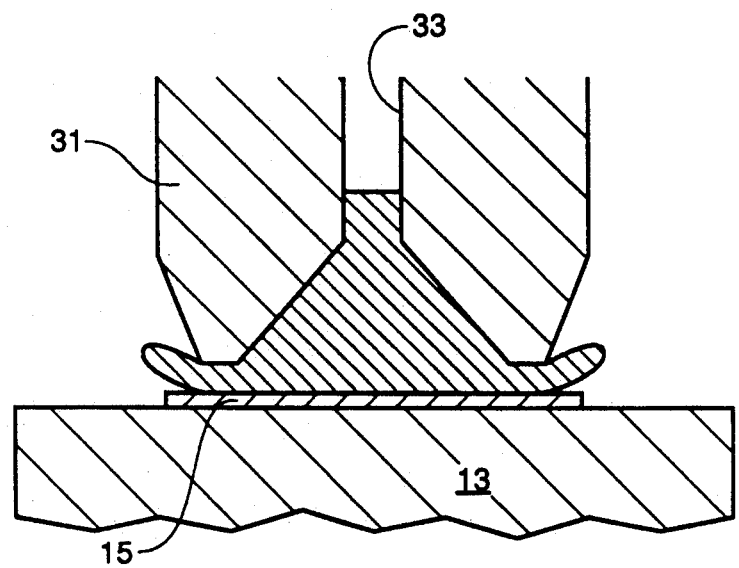
FIG. 6 shows the raised portion of FIG. 5 engaged by the wirebonder probe of FIG. 5.
Figure 7:
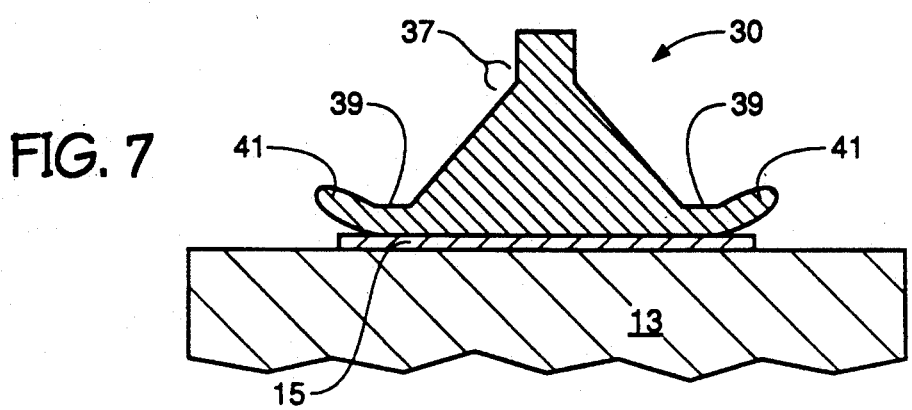
FIG. 7 shows an ultrasonically formed elevated surface irregularity formed by the engagement of the raised portion by the wirebonder probe of FIG. 5.

Once the distortion of the bumps occurs, as shown in FIGS. 2 and 4, it is necessary to form a raised area on the surface for subsequent contacts. In addition, it may be necessary to enhance the raised portion of any surface in order to establish an electrical contact. In order to reform a raised portion of the substrate's conductive layer 15, an elevated surface irregularity 30 is formed on the bump 17, as shown in FIGS. 5–7.

Ultrasonically forging is used to form a raised area, or ultrasonically formed elevated surface irregularity 30. The raised area is formed as a raised portion of a surface. The ultrasonic energy is preferrably in the vicinity of 60 KHz, although it is possible to operate wirebonders at a wide variety of frequencies, ranging from perhaps 1 KHz to 1000 KHz, or from 6 KHz to 600 KHz. The current frequency used on all K&S (Kulicke & Soffa Industries, Inc. Willow Grove, Pa.) wire bonders is 59.9 KHz. It is known that increasing frequency results in decreasing bond times. Increased frequency will increase the rate of chemical reaction at the interface surfaces.

One possible problem with increased frequency is cratering. A higher frequency will travel more easily through silicon increasing the potential for damage under the bond pads. Therefore, a higher frequency than the standard 60 KHz may be useful in ultrasonically forging to form an elevated surface irregularity 30 because the increased cratering may also result in a higher raised surface irregularity 30 for a given area of disturbed surface.

The preferred temperature for ultrasonic forging, including ultrasonically forging to form an elevated surface irregularity, ranges from ambient to the maximum temperatures tolerated by the die or underlying material. For ordinary wirebonding the pad wire interface is heated to 180° C. For ultrasonically forging to form an elevated surface irregularity, the preferred temperature ranges are from ambient to the maximum temperature tolerated by the surface. This may preferrably range from 10° C. to 400° C., or from 15° C. to 250° C. and more preferrably, with the material preheated to from 150° C. to 250° C.

Ultrasonically forging to form an elevated surface irregularity is performed by energizing a wirebonder tool head or probe 31 with ultrasonic energy in a manner well-known to those skilled in the art of wirebonding. The wirebonder head 31 is then brought into engagement with the bump 17 and causing material from the bump 17 to distort and conform to the wirebonder head 31, during which time, the wirebonder head 31 is maintained in its energized state. Significantly, the wirebonder head 31 has a center aperature 33 which is intended to be used to feed leadwire for wirebond attachment. The center aperature 33 terminates with a frustroconical portion 35 which forms a part of the center aperature. The material from the bump 17, in distorting, enters the center aperature 33 and thereby forms an erect raised portion 37 which extends into the aperature 33.

The wirebonder head 31 is then withdrawn, thus leaving the erect raised portion 37. The surrounding area forms a depression 39, which is depressed below the height of the erect raised portion 37. The raised portion results from material from a substrate being drawn up through an aperature in a tool head as a result of the use of energy applied to the substrate. If the wirebonder head 31 is sufficiently narrow, a ridge 41 is formed circumferentially external of the depressed surrounding area. The resulting form of the distorted material is the ultrasonically formed elevated surface irregularity 30.

Ultrasonically forging to form an elevated surface irregularity can be repeated as long as there is enough material to form the elevated surface irregularity 30.

Such repetitive ultrasonic forging is anticipated in the case of forming contacts for the purpose of temporarily connecting bare semiconductor dies, in which the ultrasonically formed elevated surface irregularity 30 is used as a contact to engage bondpads on successive dies. The contacts would typically be on a connector substrate or in a temporary integrated circuit package.

Figure 8:
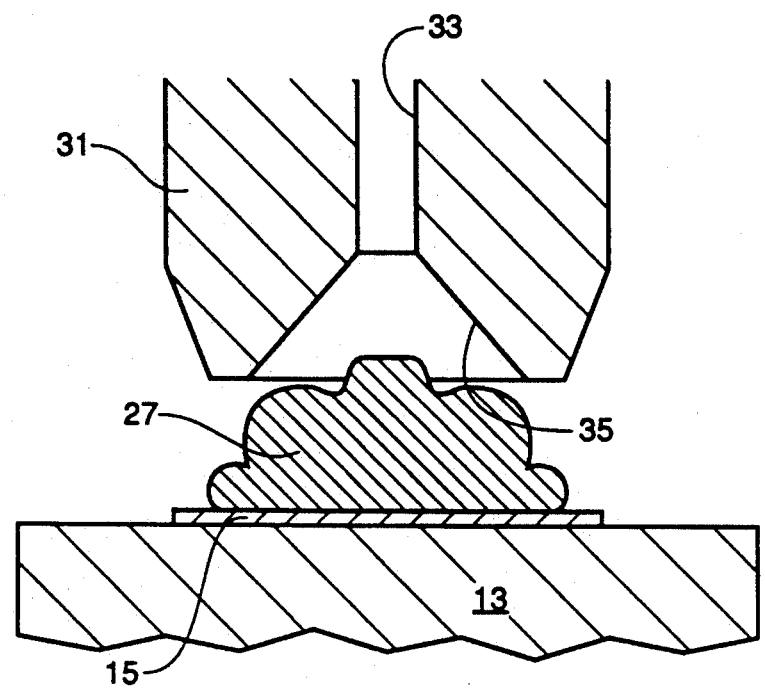
FIG. 8 shows the distorted ball bond of FIG. 4 prior to being engaged by a wirebonder probe.
Figure 9:
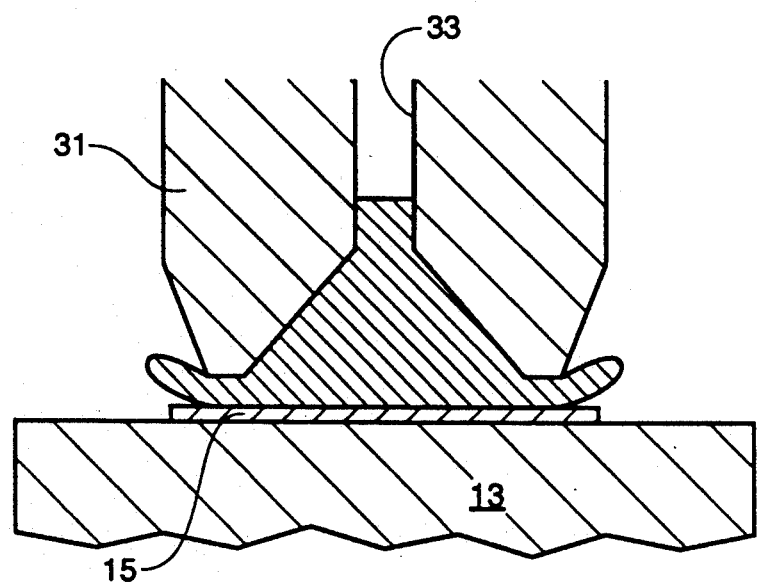
FIG. 9 shows the ball bond of FIG. 8 engaged by the probe.

It is also possible to use the inventive ultrasonic forging process to reform a distorted ball bond, such as the ball bond of FIG. 4. FIGS. 8–9 shows the use of a wirebonder head 31 on the distorted ball bond 27. The result would be a similar to that shown in FIG. 7 because the shape of the raised portion of an elevated surface irregularity resulting from ultrasonic forging is largely dependent on the shape of the head 31 and the amount of material worked.

Since the shape of the wirebonder tool head 31 to a great extent controls the shape of the ultrasonically formed elevated surface irregularity 30, it is possible to use a head 45 which avoids forming a large ridge such as ridge 41. Such a head is shown in FIGS. 9–11, in which the shape of the head 45 predicts the desired shape of the resulting ultrasonically formed elevated surface irregularity 47, shown in FIG. 12. This can be used to reduce the raised ridge 41 which could result from the work material being exuded past the sides of a wirebonder head.

Figure 13:
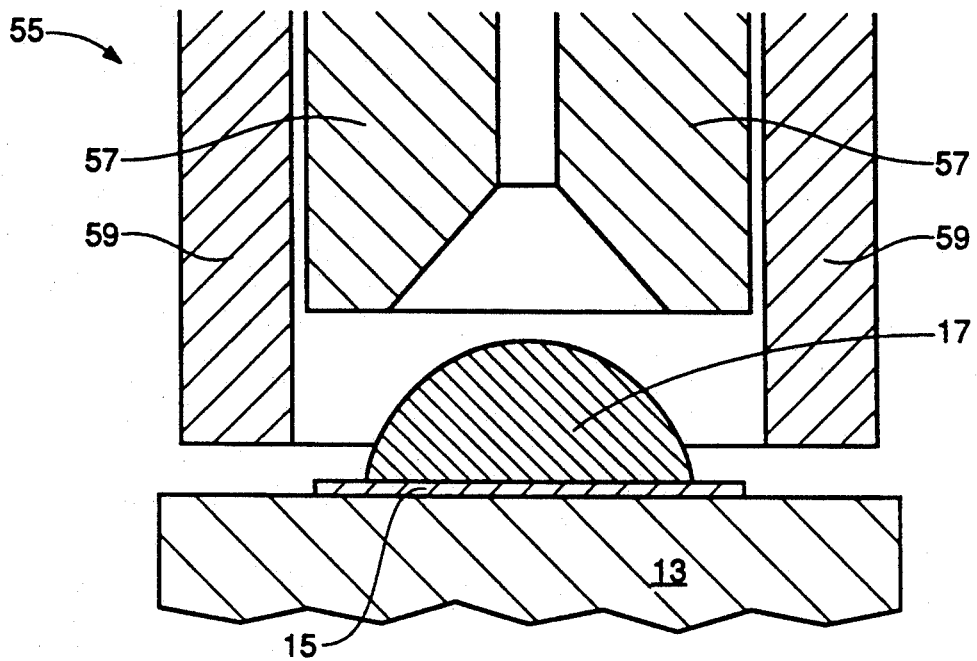
FIGS. 13 and 14 show a modified probe having a sleeve being used to control the ridge surrounding the crater.
Figure 14:
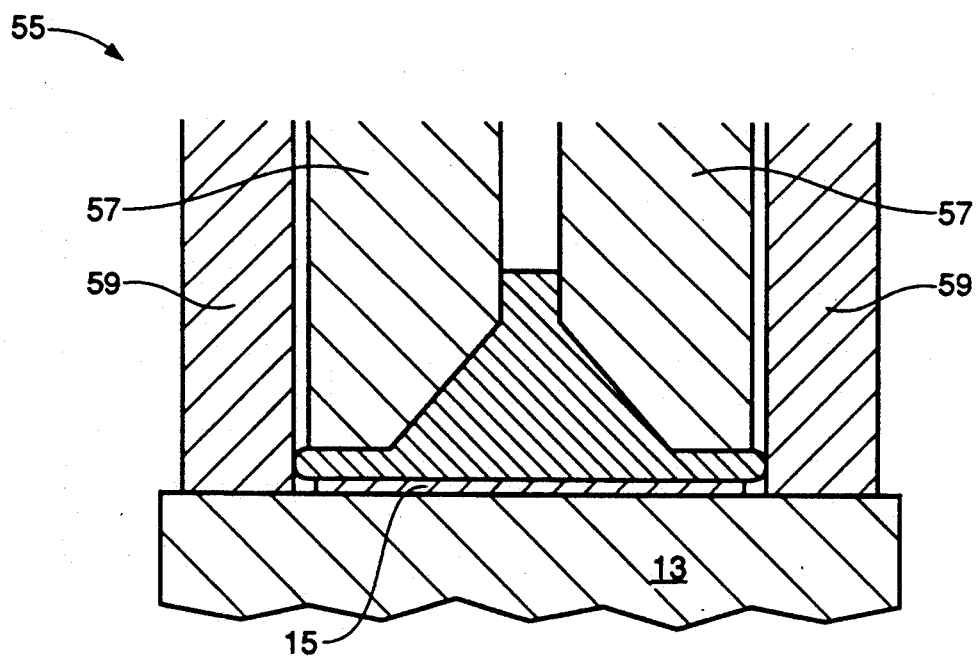

FIGS. 13–14 show a modified head 55 which includes a main portion 57 and a sleeve 59. The sleeve 59 functions as a shroud to reduce the tendency of forged material to form a raised ridge (such as ridge 41 in FIG. 7). This results in an ultrasonically formed elevated surface irregularity 61 which has a confined outer perimeter. The sleeve 59 may be slidably mounted to the main portion so as to recede upwardly away from the substrate 13 as the head 55 is brought to bear down on the work. The sleeve 59 may also be vibrationally isolated from the main portion 57 of the head in order to attenuate vibrational energy transferred from the main portion 57 of the head to the sleeve 59.

Figure 15:
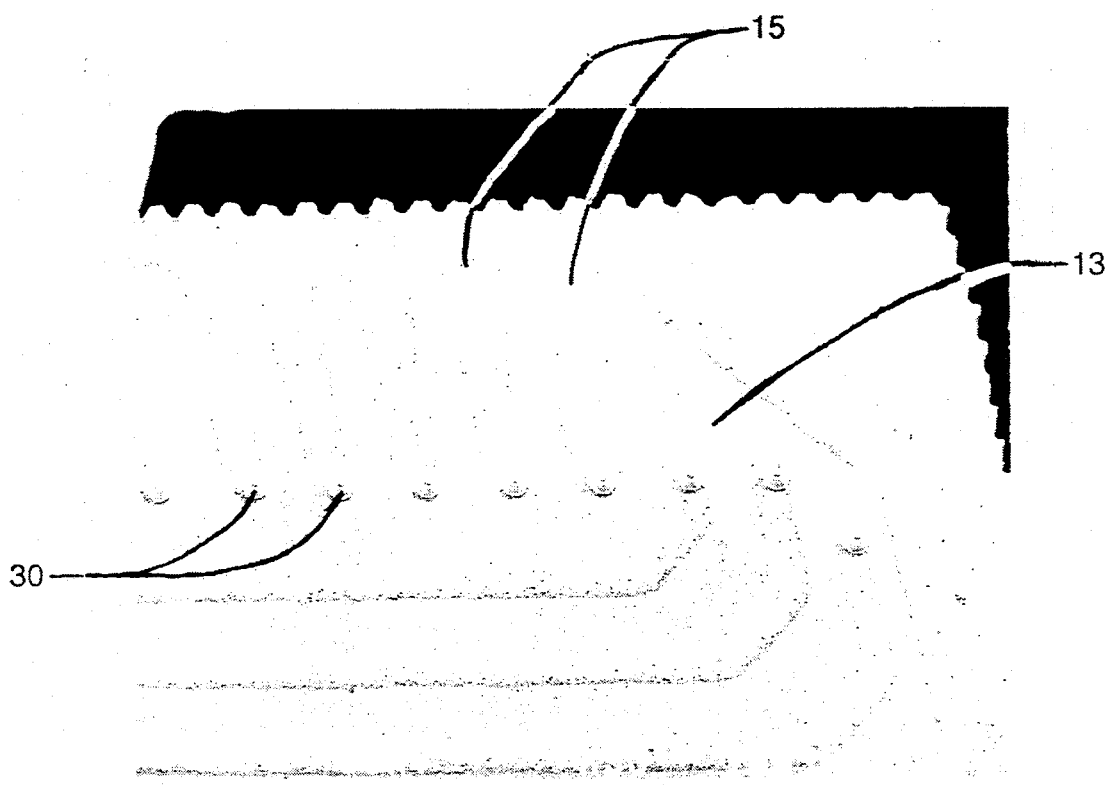
FIGS. 15–16 are low resolution scans of photomicrographs of ultrasonically formed elevated surface irregularities used as forged contacts.
Figure 16:

The results of using the inventive techniques can be seen in FIGS. 15 and 16, which are low resolution scanned photomicrographs of electrical conductors with ultrasonically formed elevated surface irregularities formed thereon.

Figure 17:
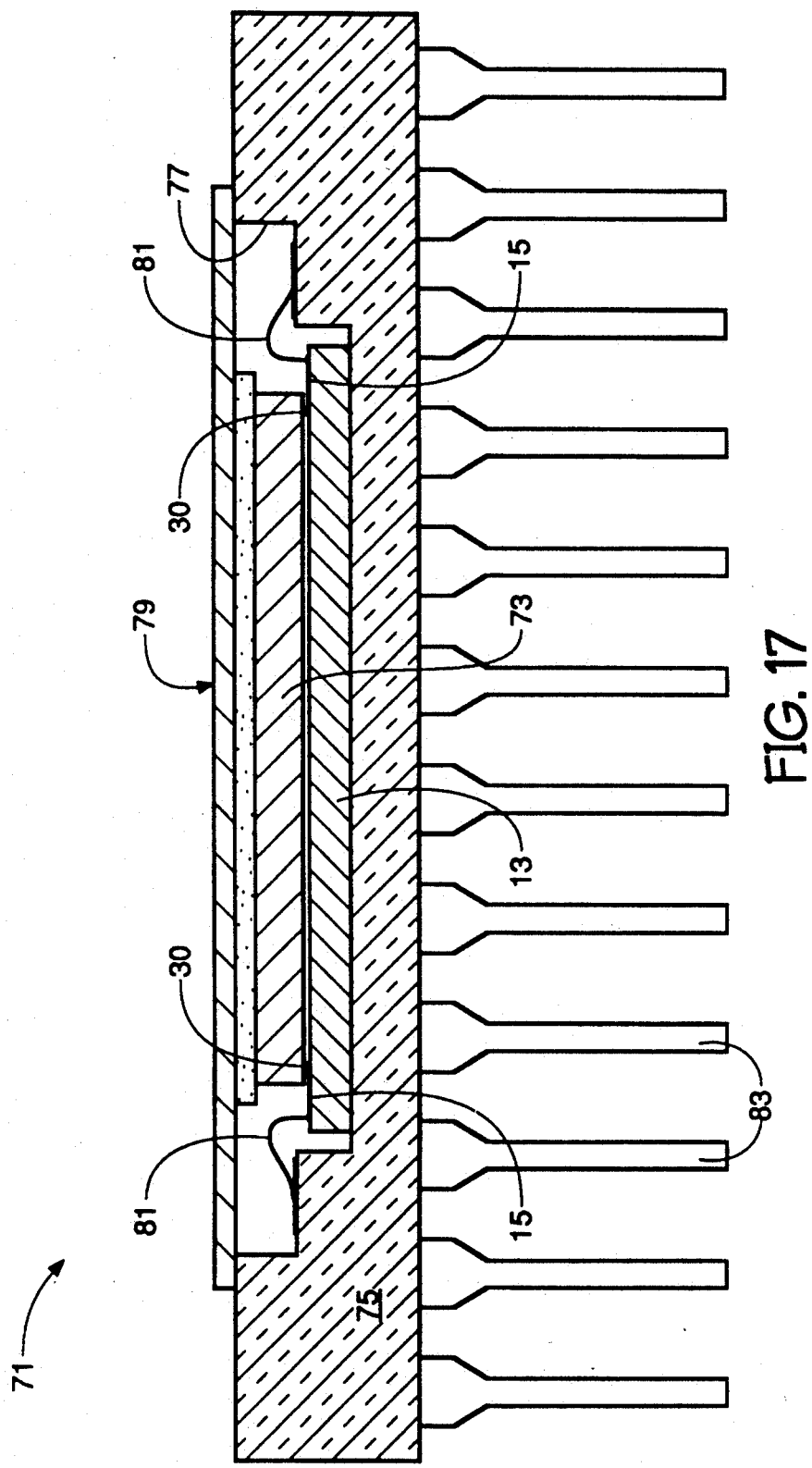
FIG. 17 shows a semiconductor test package employing ultrasonically formed elevated surface irregularities of the invention.

As shown in FIG. 17, the substrate 13 and conductive layer 15 was designed for use as a connector inside of a reusable burn-in/test fixture 71 for discrete die 73. A first half 75 of the test fixture 71 contains a cavity 77 in which the die 73 is inserted. The substrate 13 is placed inside the fixture 71 so that the conductive layer 15 faces the die 73. A second half 79 of the fixture 71 is then used to cover the cavity 77. The ultrasonically formed elevated surface irregularities 30 are aligned to engage bondpads on the die 73. The conductive layer, which consists of a series of electrical isolated traces, communicate with the bondpads through the ultrasonically formed elevated surface irregularities 30, and are electrically connected to connector terminals 81 on the fixture 71. The substrate 13 may be a separate element, as shown, or may be a part of the first or second halves 75, 77 of the test fixture 71.

Temporary connections to bondpads on the die 73 with the terminals 81 on the fixture may then be accomplished by alignment of the bondpads with the ultrasonically formed elevated surface irregularities 30.

While the invention was described in terms of a specific substrate, the inventive techniques are useful for other types of environments, such as for establishing asperities on other connection surfaces and for establishing asperities for non-electrical purposes. It is also contemplated that the invention may be applied to forming elevated surface irregularities on semiconductor dies and on other electrical devices.

We claim:

1. A head for use in ultrasonic forging comprising:
   a) a central portion, the central portion having a work contacting surface with a recess and an outer periphery;
   b) a sleeve surrounding the outer periphery juxtaposed to the work contacting surface;
   c) the sleeve being mounted to the central portion in such a manner as to attenuate vibrational energy being transferred from the central portion to a workpiece.

2. The head for use in ultrasonic forging of claim 1, further comprising:
   the sleeve being mounted to the central portion so that, when the central portion is contacting a workpiece, the sleeve is sufficiently separate from the workpiece to achieve said attenuation of vibrational energy being transferred to a workpiece.

3. The head for use in ultrasonic forging of claim 1, further comprising:
   the sleeve being mounted to the central portion with a vibrational isolation mounting so that, when the central portion is contacting a workpiece, the sleeve is sufficiently isolated from the workpiece so as to achieve said attenuation of vibrational energy being transferred to a workpiece.

4. The head for use in ultrasonic forging of claim 1, further comprising:
   the sleeve being slidably mounted to the central portion so that, when the central portion is contacting a workpiece, the sleeve is able to retract in a direction substantially normal to a surface of a workpiece, thereby attenuating vibrational energy being transferred to the workpiece through the sleeve.

5. The head for use in ultrasonic forging of claim 1, wherein the head functions by:
   a) applying ultrasonic energy to a surface, the ultrasonic energy causing a perturbation in the surface sufficient to ultrasonically forge material below the surface, thereby plastically distorting the surface;
   b) the head being withdrawn from the surface while completely separating from the raised portion without effecting a further connection of the raised portion; and
   c) whereby the raised portion may be used as an electrical contact.

6. The head for use in ultrasonic forging of claim 5, further comprising:
   the ultrasonic energy is used to cause distortion by forming a raised portion of the forged material, surrounded by a crater in the forged material.

7. The head for use in ultrasonic forging of claim 1, further comprising:
   an aperture therein which is located at an end of the head which is closest to a workpiece being forged.

8. The head for use in ultrasonic forging of claim 7, further comprising:
   the ultrasonic energy is used to cause distortion by forming a raised portion of the forged material, surrounded by a crater in the workpiece.

9. A head for use in ultrasonic forging comprising:

a) a central portion, the central portion having a work contacting surface with a recess and an outer periphery;
b) a sleeve surrounding the outer periphery juxtaposed to the work contacting surface;
c) the sleeve being mounted to the central portion in such a manner as to attenuate vibrational energy being transferred from the central portion to the sleeve.

10. The head for use in ultrasonic forging of claim 9, further comprising:
the sleeve being mounted to the central portion so that, when the central portion is contacting a workpiece, the sleeve is sufficiently separate from the workpiece to achieve said attenuation of vibrational energy being transferred to a workpiece.

11. The head for use in ultrasonic forging of claim 9, further comprising:
the sleeve being mounted to the central portion with a vibrational isolation mounting so that, when the central portion is contacting a workpiece, the sleeve is sufficiently isolated from the workpiece so as to achieve said attenuation of vibrational energy being transferred to a workpiece.

12. The head for use in ultrasonic forging of claim 9, further comprising:
the sleeve being slidably mounted to the central portion so that, when the central portion is contacting a workpiece, the sleeve is able to retract in a direction substantially normal to a surface of a workpiece, thereby attenuating vibrational energy being transferred to the workpiece through the sleeve.

13. A head for use in ultrasonic forging with an ultrasonic forging device comprising:
a) a central portion, the central portion having a work contacting surface with a recess and an outer periphery;
b) a sleeve surrounding the outer periphery juxtaposed to the work contacting surface;
c) the sleeve being mounted to the central portion in such a manner as to surround the central portion and thereby limit movement of material on a workpiece from an area of the workpiece juxtaposed to the central portion to an area beyond an area of the workpiece juxtaposed to the sleeve, the mounting of the sleeve to the central portion attenuating vibrational energy which is transferred to the workpiece through the sleeve by said ultrasonic forging device.

14. The head for use in ultrasonic forging of claim 13, further comprising:
the sleeve being mounted to the central portion so that, when the central portion is contacting a workpiece, the sleeve is sufficiently separate from the workpiece to achieve said attenuation of vibrational energy being transferred to a workpiece.

15. The head for use in ultrasonic forging of claim 13, further comprising:
the sleeve being mounted to the central portion with a vibrational isolation mounting so that, when the central portion is contacting a workpiece, the sleeve is sufficiently isolated from the workpiece so as to achieve said attenuation of vibrational energy being transferred to a workpiece.

16. The head for use in ultrasonic forging of claim 13, further comprising:
the sleeve being slidably mounted to the central portion so that, when the central portion is contacting a workpiece, the sleeve is able to retract in a direction substantially normal to a surface of a workpiece, thereby achieving said attenuation of vibrational energy being transferred to the workpiece through the sleeve.

* * * * *